US011275201B2

United States Patent
Aurongzeb

(10) Patent No.: US 11,275,201 B2
(45) Date of Patent: Mar. 15, 2022

(54) DISPLAY DEVICE INCLUDING POROUS LAYERS

(71) Applicant: Dell Products L.P., Round Rock, TX (US)

(72) Inventor: Deeder M. Aurongzeb, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 96 days.

(21) Appl. No.: 16/893,755

(22) Filed: Jun. 5, 2020

(65) Prior Publication Data

US 2021/0382204 A1 Dec. 9, 2021

(51) Int. Cl.
| | |
|---|---|
| G02B 1/118 | (2015.01) |
| G02F 1/1368 | (2006.01) |
| H01L 51/52 | (2006.01) |
| G02F 1/1335 | (2006.01) |
| G02B 1/11 | (2015.01) |

(52) U.S. Cl.
CPC ............... G02B 1/118 (2013.01); G02B 1/11 (2013.01); G02F 1/1368 (2013.01); G02F 1/133502 (2013.01); G02F 1/133528 (2013.01); H01L 51/5281 (2013.01)

(58) Field of Classification Search
CPC ........... G02F 1/133502; G02F 2201/38; G02F 2201/04; G02F 1/133504; H01L 51/5281; G02B 1/11; G02B 5/021; G02B 5/0221; B60J 3/06
See application file for complete search history.

(56) References Cited

U.S. PATENT DOCUMENTS

| | | | | |
|---|---|---|---|---|
| 2006/0049745 | A1* | 3/2006 | Handa | H01L 51/5268 313/503 |
| 2008/0316602 | A1* | 12/2008 | Kameshima | G02B 1/11 359/599 |
| 2011/0181810 | A1* | 7/2011 | Miyamoto | G02F 1/133606 349/64 |
| 2013/0215513 | A1* | 8/2013 | Liang | C23C 18/122 359/601 |
| 2014/0049822 | A1* | 2/2014 | Gollier | G02B 5/021 359/488.01 |
| 2018/0348577 | A1* | 12/2018 | Pousthomis | H01L 33/50 |
| 2020/0333593 | A1* | 10/2020 | Bard | B32B 17/10036 |
| 2021/0149245 | A1* | 5/2021 | Li | G02F 1/133528 |

* cited by examiner

*Primary Examiner* — Michael H Caley
*Assistant Examiner* — Jonathan Y Jung
(74) *Attorney, Agent, or Firm* — Baker Botts L.L.P.

(57) ABSTRACT

A display structure for an information handling system, including a top surface layer; a first nanoporous layer; a first polarizer layer; a thin-film-transistor (TFT) layer; a second polarizer layer; and a back light layer, wherein the first nanoporous layer is positioned between the top surface layer and the first polarizer layer, and wherein the first nanoporous layer has an index of refraction less than the index of refraction of the top surface layer to reduce specular reflection of the display structure.

18 Claims, 9 Drawing Sheets

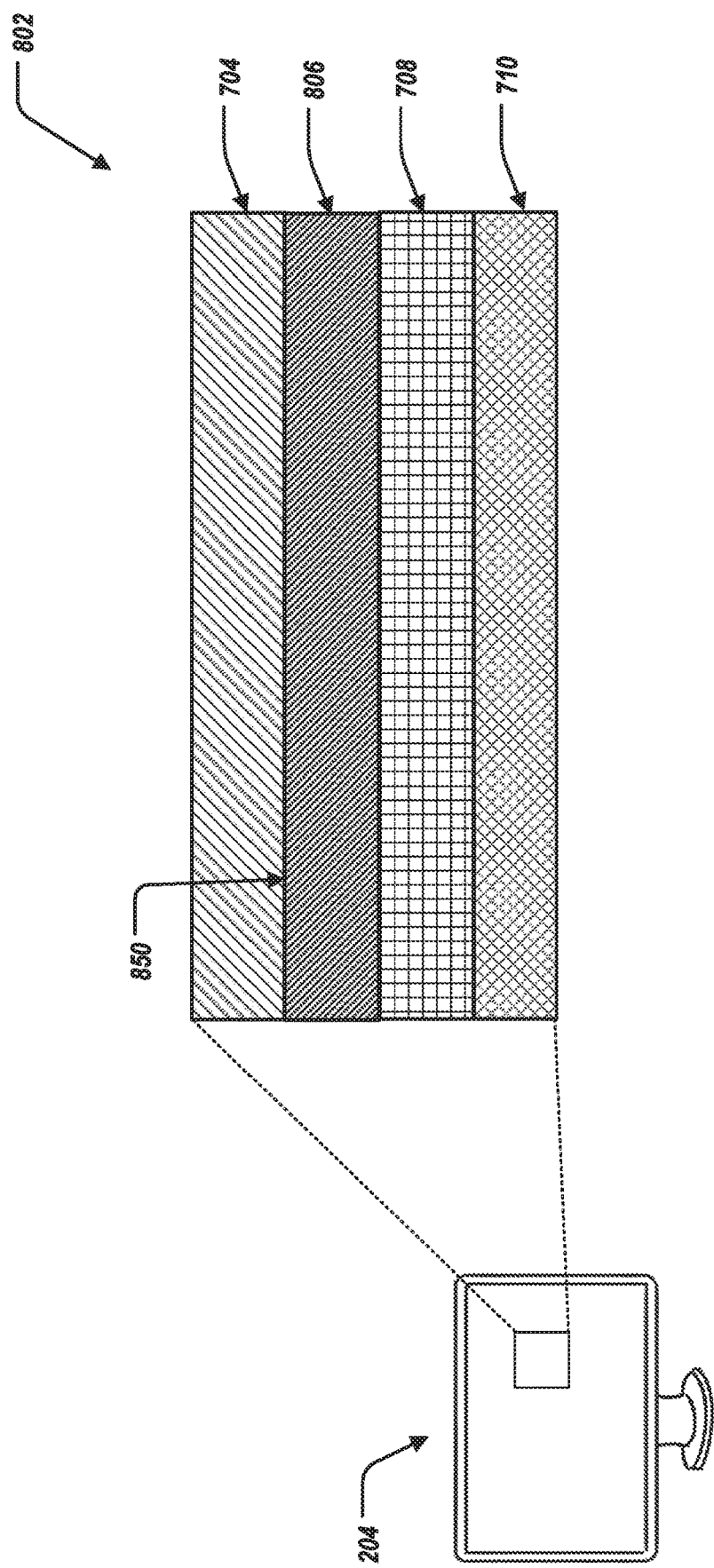

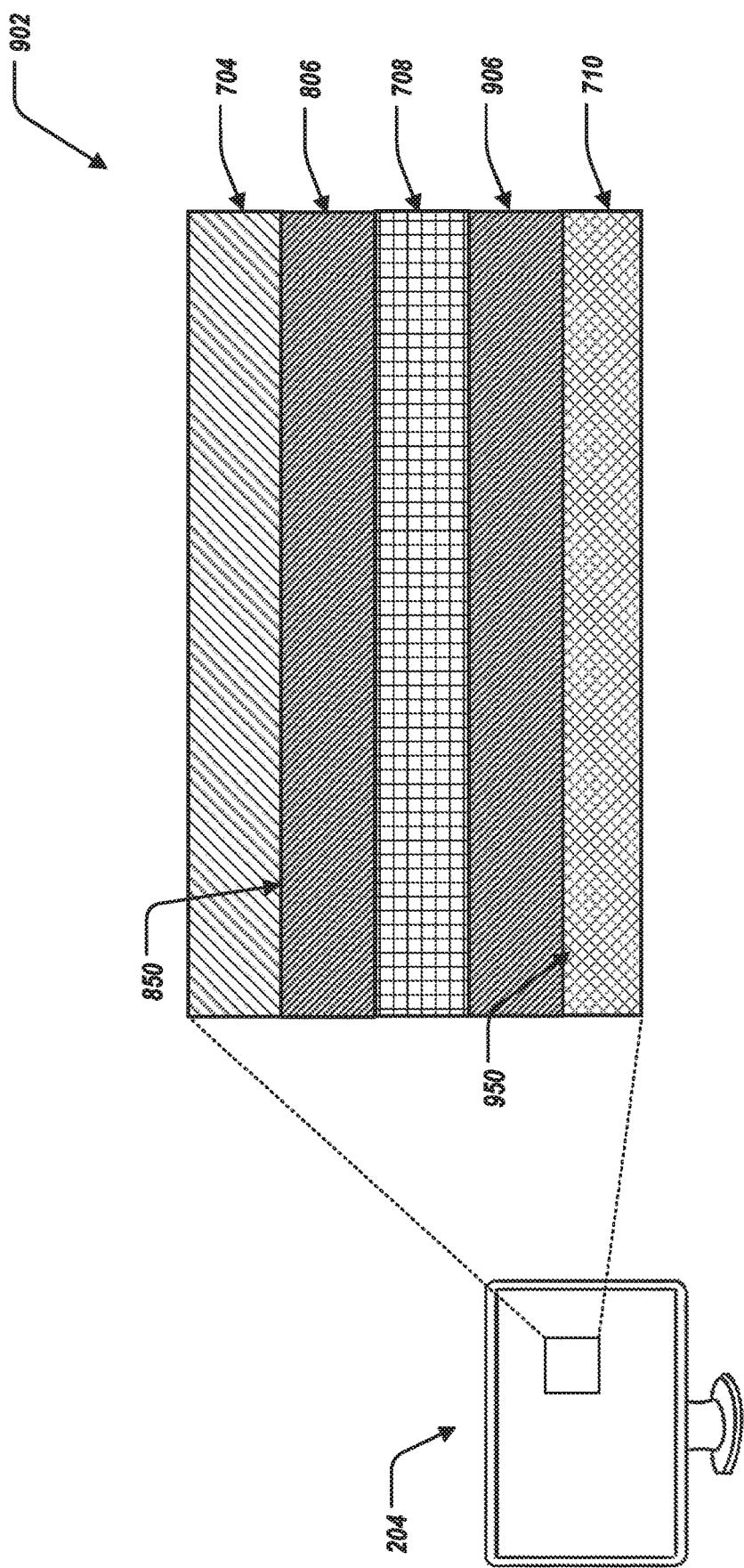

DISPLAY DEVICE INCLUDING POROUS LAYERS

BACKGROUND

Field of the Disclosure

The disclosure relates generally to information handling systems, and specifically, a display device of the information handling system that includes porous layers.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

To mitigate display surface reflectivity, the industry is using such approaches as anti-reflection (AR), anti-glare (AG), or a combination of both. Light sources present in an office environment can present a challenge to the AR as the brightness of the light source is concentrated, specular reflection (point source or line source), and is several orders of magnitude higher than the average office illumination environment.

SUMMARY

Innovative aspects of the subject matter described in this specification may be embodied in a display structure for an information handling system including a top surface layer; a first nanoporous layer; a first polarizer layer; a thin-film-transistor (TFT) layer; a second polarizer layer; and a back light layer, wherein the first nanoporous layer is positioned between the top surface layer and the first polarizer layer, and wherein the first nanoporous layer has an index of refraction less than the index of refraction of the top surface layer to reduce specular reflection of the display structure.

These and other embodiments may each optionally include one or more of the following features. For instance, further comprising a second nanoporous layer positioned between the first polarizer layer and the TFT layer, wherein the second nanoporous layer has an index of refraction less than the index of refraction of the TFT layer to reduce specular reflection of the display structure. Further comprising a first mesoporous layer positioned on the top surface layer. Further comprising a second mesoporous layer positioned between the first nanoporous layer and the first polarizer layer. The top surface layer is glass. The top surface layer is plastic. The index of refraction of the first nanoporous layer is less than 1.5. The index of refraction of the first nanoporous layer is approximately 1.3. The index of refraction of the first nanoporous layer is approximately 1.13. The specular reflection of the display structure is approximately 1.6 percent of incident light upon the display structure. The display structure is a liquid crystal display (LCD) display structure.

Innovative aspects of the subject matter described in this specification may be embodied in a display structure for an information handling system, including a top surface layer; a first nanoporous layer; a polarizer layer; and an organic light emitting diode (OLED) film layer, wherein the first nanoporous layer is positioned between the top surface layer and the polarizer layer, and wherein the first nanoporous layer has an index of refraction less than the index of refraction of the top surface layer to reduce specular reflection of the display structure.

These and other embodiments may each optionally include one or more of the following features. For instance, further comprising a second nanoporous layer positioned between the polarizer layer and the OLED film layer, wherein the second nanoporous layer has an index of refraction less than the index of refraction of the OLED film layer to reduce specular reflection of the display structure. Further comprising a mesoporous layer positioned on the top surface layer. The top surface layer is glass. The top surface layer is plastic. The index of refraction of the nanoporous layer is less than 1.5. The index of refraction of the nanoporous layer is approximately 1.3. The index of refraction of the nanoporous layer is approximately 1.13. The display structure is an OLED display structure.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

FIG. 8 illustrates an example cross-sectional view of the display device of FIG. 7, including a nanoporous layer.

FIG. 9 illustrates an example cross-sectional view of the display device of FIG. 8, including an additional nanoporous layer.

DESCRIPTION OF PARTICULAR EMBODIMENT(S)

Figure 1:
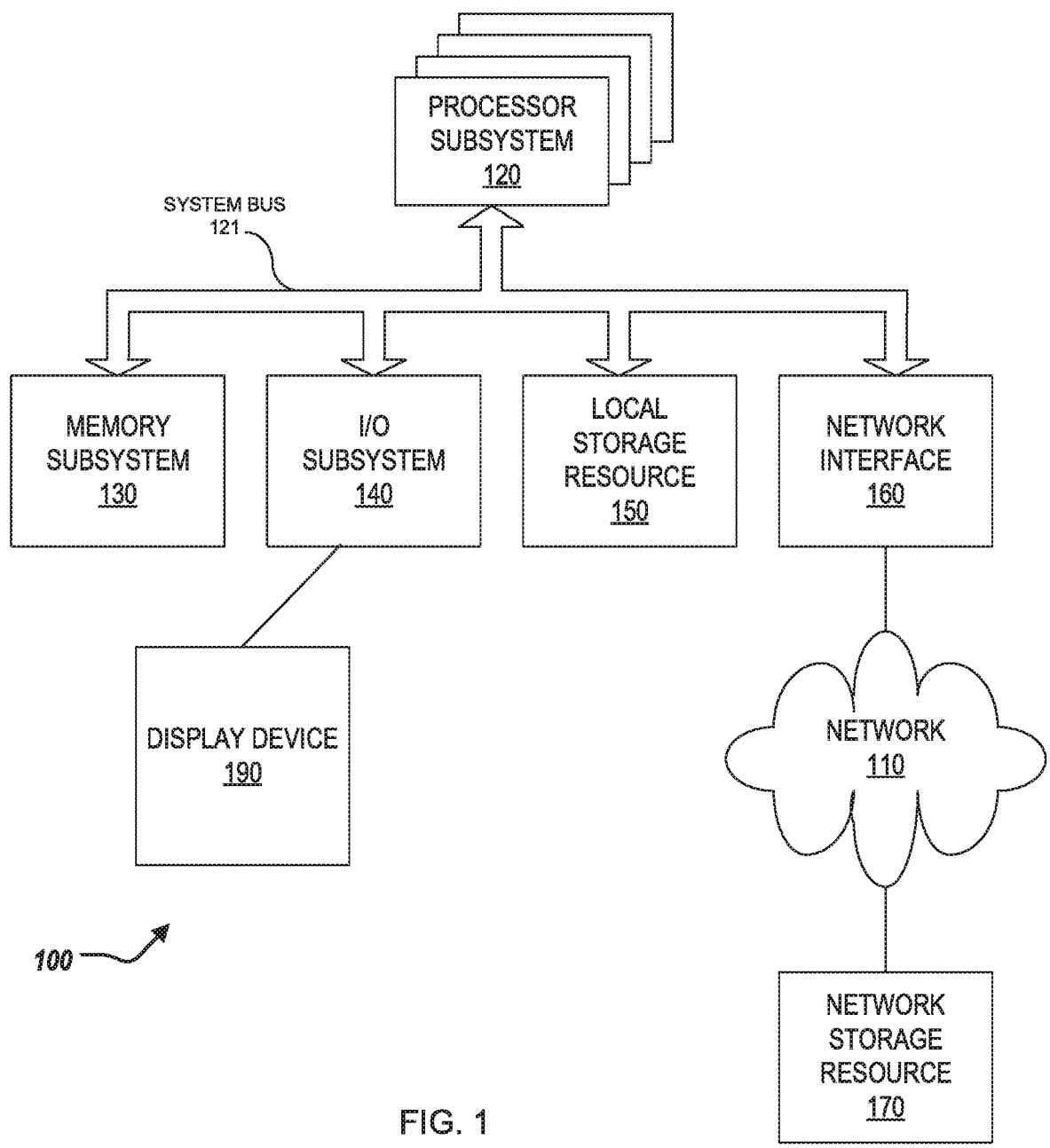
FIG. 1 illustrates a block diagram of selected elements of an embodiment of an information handling system.

This disclosure discusses a display structure for a display device of an information handling system. The display structure can be a liquid crystal display (LCD) display structure or an organic light emitting diode (OLED) display structure. The display structure can include multiple layers. Incoming light (e.g., from a light source such as a light stand or sunlight from a window) can be incident on the display structure. The display structure can reflect a portion of such incident light. The incident light can be concentrated on a particular section of the display structure making viewing of such section difficult to a user (e.g., a specular reflection "hotspot"). To reduce such brightness of the reflection by the display structure, the display structure can include additional internal layers that have a low index of refraction. Specifically, internal layers of the display structure can each reflect the incident light at an interface of a change of layers. Furthermore, the reflection of such light is based on (directly correlated to) the index of refraction of such layers. By introducing additional layers that are of a lower of index of refraction internal to the display device, the brightness (or power) of such reflected light by the display structure is reduced, providing an improved user experience. The additional layers can include nanoporous layers and/or mesoporous layers that have a low index of refraction as compared to previous layers of the display structure.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-9 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can include display device 190. For example, the display device 190 can be included by the I/O subsystem 140, and/or in communication with the I/O subsystem 140.

The display device 190 can include multiple internal layers, including layers to reduce a brightness (or power) of reflected light that is incident upon the display device 190. For example, the display device 190 can include nanoporous layers that have a lower index of refraction as compared to existing layers of the display device 190, which reduces and/or minimizes the brightness (or power) of such reflected light, described further herein.

Figure 2:
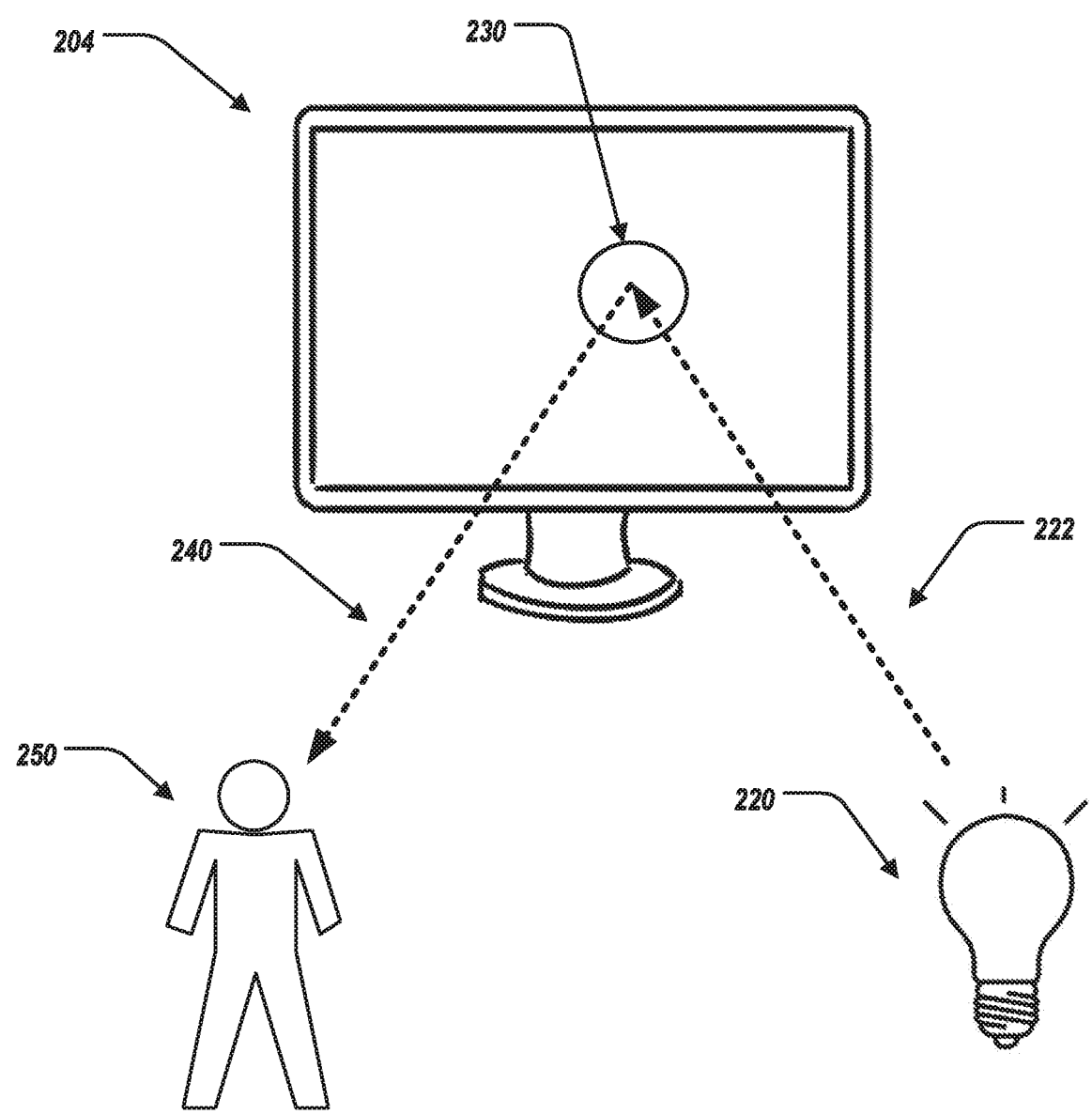
FIG. 2 illustrates a diagram of a user with respect to a display device of the information handling system.

FIG. 2 illustrates a display device 204. The display device 204 can be substantially the same, or similar to, the display device 190 of FIG. 1. The display device 204 can be a monitor for a desktop computing system, a display screen for a laptop computing device, or any display for any type of information handling system (e.g., smartphone computing device, tablet computing device, wearable computing device).

The display device 204 can experience specular reflection. Specifically, a light source 220 can provide incoming light 222 that is incident on the display device 204 predominantly at a location 230. In some examples, the light source 220 can include multiple light sources of distinct sizes that provide different illumination intensities and/or different color temperatures. The location 230 can have a higher that normal distribution of incoming light from the light source 220 (e.g., the location 230 is a "hotspot") as compared to the rest of the display device 204. The display device 204 can provide reflected light 240 from the light source 220 to the user 250. The reflected light 240 can make viewing of the display device 204, and in particular, the location 230 of the display device 204, cumbersome and difficult for the user 250.

Figure 3:
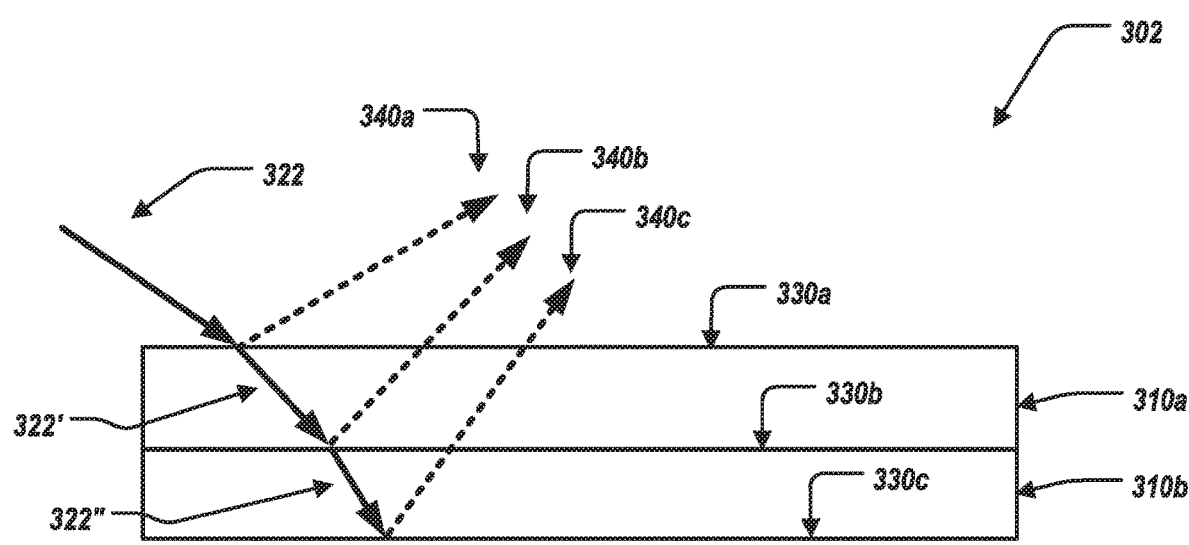
FIG. 3 illustrates an example cross-sectional view of the display device, showing reflected light.

FIG. 3 illustrates an example cross-sectional view of an example display stack 302 of the display device 204. The display stack 302 can include display layers that constitute the display device 204. To that end, each of the layers of the display device 204 can reflect at least a portion of light that is incident upon it. Specifically, at each interface of layers of the display device 204, the layers of the display device 204 can reflect at least a portion of light that is incident upon an associated interface. That is, every "switch of materials" of the display stack 302 produces a refection of light that is incident upon it.

For example, the display stack 302 can include a first layer 310a and a second layer 310b (collectively referred to as layers 310). Incoming light 322 can be incident upon the display stack 302, and each layer 310, such that each layer 310 provides reflected light (e.g., at an intersection of each layer 310). Specifically, the incoming light 320 is incident upon a surface 330a of the first layer 310a. The surface 330a of the first layer 310a is at an interface between the first layer 310a and a surrounding environment (e.g., air). A portion of the incoming light 322 that is incident upon the surface 330a of the first layer 310a can be reflected by the first layer 310a as reflected light 340a. The brightness (or luminescence or power) of the reflected light 340a can be based on the index of refraction of the first layer 310a and the index of refraction of the surrounding environment (e.g., air). For example, the ratio of the amount of light that is reflected at surface 330a (the reflected light 340a) to the amount of light incident at surface 330a (incoming light 322) can be correlated (based on or a function of) the index of refraction of the first layer 310a and the index of refraction of the surrounding environment (e.g., air).

Furthermore, a portion of the incoming light 322 can transmit through the first layer 310a and become incident upon a surface 330b of the second layer 310b, shown as incoming light 322'. The surface 330b of the second layer 310b is at an interface of the first layer 310a and the second layer 310b. A portion of the incoming light 322' that is incident upon the surface 330b of the second layer 310b (interface between the first layer 310a and the second layer 310b) can be reflected by the second layer 310b as reflected light 340b. The brightness (or luminescence or power) of the reflected light 340b can be based on the index of refraction of the first layer 310a and the index of refraction of the second layer 310b. For example, the ratio of the amount of light that is reflected at surface 330b (the reflected light 340b) to the amount of light incident at surface 330b (incoming light 322') can be correlated (based on or a function of) the index of refraction of the first layer 310a and the index of refraction of the second layer 310b.

Additionally, a portion of the incoming light 322' can transmit though the second layer 310b and become incident upon a surface 330c of the second layer 310b, shown as incoming light 322''. The surface 330c of the second layer 310b is at an interface of the second layer 310b and a surrounding environment (e.g. air). A portion of the incoming light 322'' that is incident upon the surface 330c of the second layer 310b can be reflected by the second layer 310b as reflected light 340c. The brightness (or luminescence or power) of the reflected light 340c can be based on the index of refraction of the second layer 310b and the index of refraction of the surrounding environment (e.g., air). For example, the ratio of the amount of light that is reflected at surface 330c (the reflected light 340c) to the amount of light incident at surface 330c (incoming light 322'') can be correlated (based on or a function of) the index of refraction of the second layer 310b and the index of refraction of the surrounding environment (e.g., air).

The reflected light 340a, 340b, 340c is herein referred to as reflected light 340. The reflected light 340 of the display stack 302 can result in the "hotspot" as compared to the rest of the display stack 302, similar to the location 230 as the "hotspot" of FIG. 2.

To that end, it is desirable to mitigate, reduce, and/or minimize a brightness (power, luminescence) of the reflected light 240 and 340.

Figure 4:
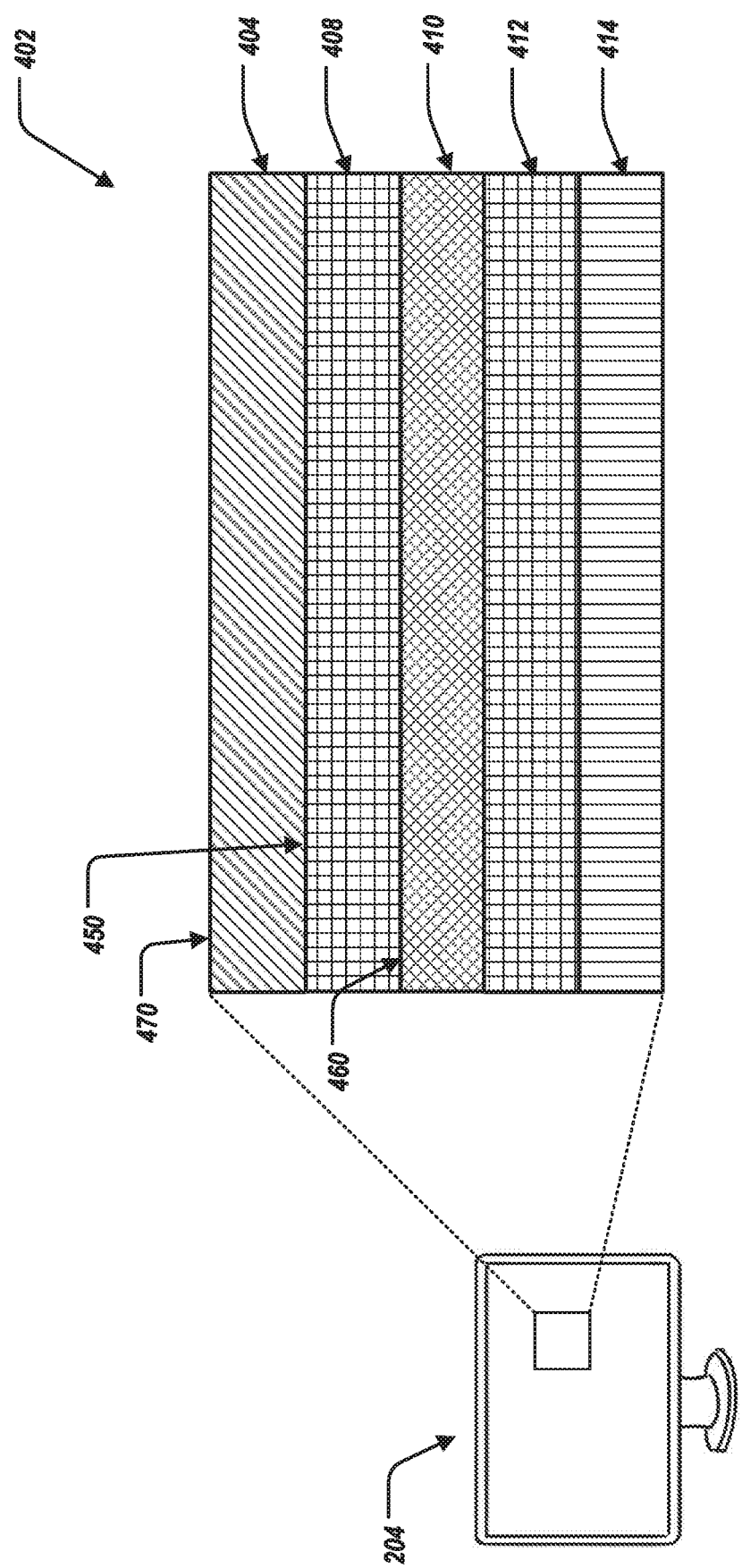
FIG. 4 illustrates an example cross-sectional view of a liquid crystal display (LCD) display device.

FIG. 4 illustrates a cross-sectional view of an example display structure 402 of the display device 204. The display structure 402 can be a liquid crystal display (LCD) display structure. The display structure 402 can include a top surface layer 404, a first polarizer layer 408, a thin-film transistor (TFT) glass layer 410, a second polarizer layer 412, and a back light layer 414. The first polarizer layer 408 is positioned between the top surface layer 404 and the TFT glass layer 410. The TFT glass layer 410 is positioned between the first polarizer layer 408 and the second polarizer layer 412. The second polarizer layer 412 is positioned between the TFT glass layer 410 and the back light layer 414. The top surface layer 404 can include glass, or plastic. The top surface layer 404 can include a cellulose triacetate film (TAC), a polystyrene material, or a cyclo-olefin polymer material.

The display device 204, and specifically, each of the layers of the display structure 402 can be associated with an index of refraction. To that end, each of the layers of the display structure 402 reflect incident light (e.g., the incoming light 222, 322) as reflected light (e.g., reflected light 240, 340) based on the index of refraction of the layer. Specifically, the amount of reflection of light that is incident upon a surface (interface) between layers of the display structure 402 is directly correlated to the index of reflection of each such layer (the index of refraction is a physical property of a material of each layer). Thus, the brightness or luminescence (or power) of the reflected light by each layer of the display structure 402 that is incident thereupon is based on the index of refraction of each layer of the display structure 402.

For example, incoming light can be incident upon a surface 450 of the top surface layer 404 that is at an interface between the top surface layer 404 and the first polarizer layer 408. The incoming light that is incident upon the surface 450 can be reflected. The reflected light can be based on (directly correlated to) the index of refraction of the top surface layer 404 and the first polarizer layer 408. That is, the brightness (luminescence, power) of the reflected light at the surface 450 between the top surface layer 404 and the first polarizer layer 408 can have a magnitude. For example, approximately 4% of the light that is incident upon the surface 450 between the top surface layer 404 and the first polarizer layer 408 can be reflected.

Figure 5:
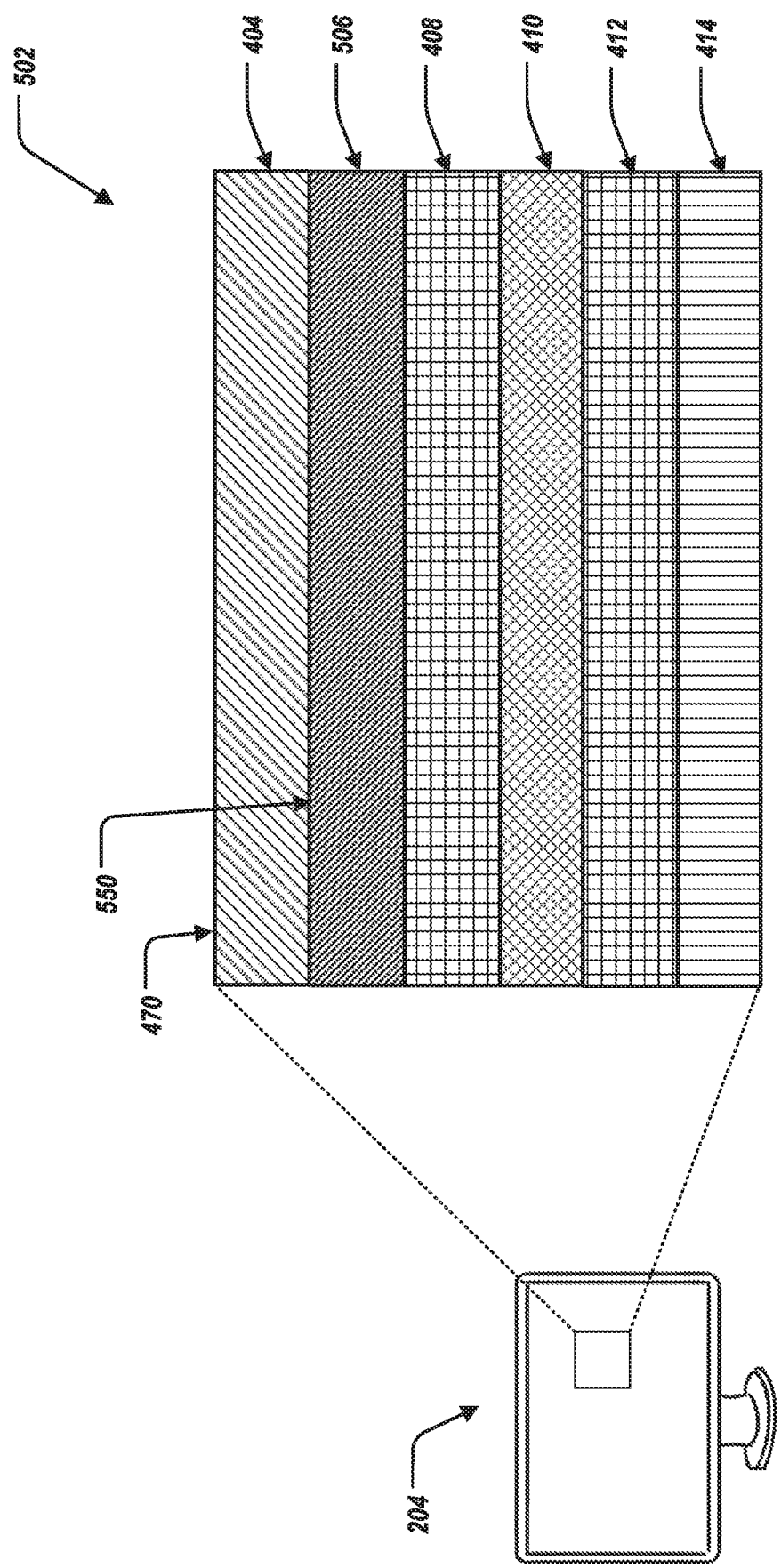
FIG. 5 illustrates an example cross-sectional view of the display device of FIG. 4, including a porous layer.

FIG. 5 illustrates a cross-sectional view of an example display structure 502 of the display device 204. The display structure 502 can include the display structure 402 of FIG. 4, and further include a porous layer 506. Specifically, the porous layer 506 is positioned between the top surface layer 404 and the first polarizer layer 408.

In some examples, the porous layer 506 includes a nanoporous material. For example, nanoporous materials can include a porous medium or a porous material that includes pores (voids). Nanoporous material can consist of a regular organic or inorganic framework supporting a regular, porous structure. The skeletal portion of the material is often called the "matrix" or "frame." The pores are typically filled with a fluid (liquid or gas). The size of the pores is generally 100 nanometers or smaller. Two examples of bulk nanoporous materials include activated carbon and zeolites.

In some examples, the porous layer 506 includes a mesoporous material. A mesoporous material is a material containing pores with diameters between 2 and 50 nm. Typical mesoporous materials include silica and alumina that have similarly-sized mesopores. Mesoporous oxides of niobium, tantalum, titanium, zirconium, cerium and tin are also possible. Another example of a mesoporous material is mesoporous carbon.

In some examples, that porous layer 506 can have an index of refraction less than the index of refraction of the top surface layer 404. In some examples, the porous layer 506 can have an index of refraction less than the index of refraction of the first polarizer layer 408. For example, when the porous layer 506 includes a nanoporous material, the porous layer 506 can have an index of refraction less than 1.5; in some examples, the porous layer 506 can have an index of refraction of approximately 1.3; and in some examples, the porous layer 506 can have an index of refraction of approximately 1.13. For example, when the porous layer 506 includes a mesoporous material, the porous layer 506 can have an index of refraction less than 1.5; in some examples, the porous layer 506 can have an index of refraction of approximately 1.34.

In some examples, the porous layer 506 can include mesoporous material and nanoporous material. That is, the porous layer 506 includes both a mesoporous layer and a nanoporous layer. In some examples, when the porous layer 506 includes both a mesoporous layer and a nanoporous layer, the nanoporous layer is positioned between the top surface layer 404 and the mesoporous layer; and the mesoporous layer is positioned between the nanoporous layer and the first polarizer layer 408.

Incoming light can be incident upon a surface 550 of the top surface layer 404 that is at an interface between the top surface layer 404 and the porous layer 506. The incoming light that is incident upon the surface 550 can be reflected. The reflected light can be based on (directly correlated to) the index of refraction of the top surface layer 404 and the porous layer 506. That is, the brightness (luminescence, power) of the reflected light at the surface 550 between the top surface layer 404 and the porous layer 506 can have a magnitude.

By introducing the porous layer 506 between the top surface layer 404 and the first polarizer layer 408, the amount of light reflected by the top surface layer 404 can be reduced and/or minimized—the brightness (luminescence or power) of the reflected light is reduced. Specifically, as a result of the porous layer 506 having an index of refraction less than the index of refraction of the top surface layer 404 and/or the first polarizer layer 408, the magnitude of the reflected light at the surface 550 between the top surface layer 404 and the porous layer 506 can be less than the magnitude of the reflected light at the surface 450 between the top surface layer 404 and the first polarizer layer 408 (as described above with respect to FIG. 4). In short, the porous layer 506 has an index of refraction less than the index of refraction of the top surface layer 404 to reduce specular reflection of the display structure 502.

For example, when the porous layer 506 includes a nanoporous material, less than 2.5 percent of the light that is incident upon the surface 550 between the top surface layer 404 and porous layer 506 is reflected. For example, approximately 1.6 percent of the light that is incident upon the surface 550 between the top surface layer 404 and porous layer 506 is reflected. For example, between 1-2.5% percent of the light that is incident upon the surface 550 between the top surface layer 404 and porous layer 506 is reflected.

Referring back to FIG. 4, incoming light can be incident upon a surface 460 of the TFT glass layer 410 that is at an interface between the TFT glass layer 410 and the first polarizer layer 408. The incoming light that is incident upon the surface 460 can be reflected. The reflected light can be based on (directly correlated to) the index of refraction of the TFT glass layer 410 and the first polarizer layer 408. That is, the brightness (luminescence, power) of the reflected light at the surface 460 between the TFT glass layer 410 and the first polarizer layer 408 can have a magnitude.

Figure 6:
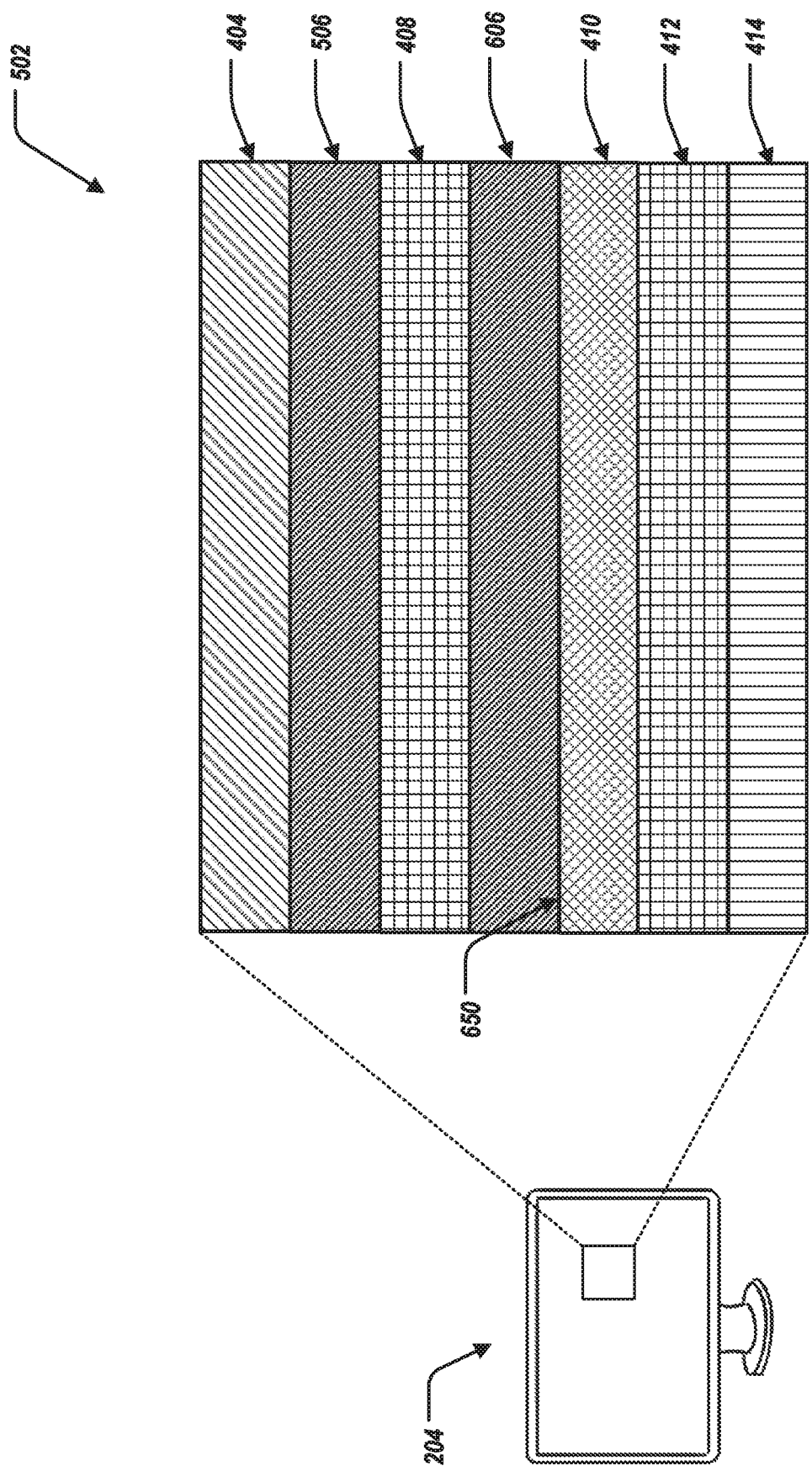
FIG. 6 illustrates an example cross-sectional view of the display device of FIG. 5, including a nanoporous layer.

FIG. 6 illustrates a cross-sectional view of an example display structure 602 of the display device 204. The display structure 602 can include the display structure 502 of FIG. 5, and further include a nanoporous layer 606. Specifically, the nanoporous layer 606 is positioned between the first polarizer layer 408 and the TFT glass layer 410. The additional nanoporous layer 606 is substantially the same as the porous layer 506 when the porous layer 506 includes the nanoporous material.

In some examples, that nanoporous layer 606 can have an index of refraction less than the index of refraction of the TFT glass layer 410. In some examples, the nanoporous layer 606 can have an index of refraction less than the index of refraction of the first polarizer layer 108. In some examples, the nanoporous layer 606 can have an index of refraction less than 1.5. In some examples, the nanoporous layer 606 can have an index of refraction of approximately 1.3. In some examples, the nanoporous layer 606 can have an index of refraction of approximately 1.13.

Incoming light can be incident upon a surface 650 of the TFT glass layer 410 that is at an interface between the TFT glass layer 410 and the additional nanoporous layer 606. The incoming light that is incident upon the surface 650 can be reflected. The reflected light can be based on (directly correlated to) the index of refraction of the TFT glass layer 410 and the nanoporous layer 606. That is, the brightness (luminescence, power) of the reflected light at the surface 650 between the TFT glass layer 410 and the additional nanoporous layer 606 can have a magnitude.

By introducing the additional nanoporous layer 606 between the TFT glass layer 410 and the first polarizer layer 408, the amount of light reflected by the TFT glass layer 410 can be reduced and/or minimized—the brightness (luminescence or power) of the reflected light is reduced. Specifically, as a result of the additional nanoporous layer 606 having an index of refraction less than the index of refraction of the TFT glass layer 410 and/or the first polarizer layer 408, the magnitude of the reflected light at the surface 650 between the TFT glass layer 410 and the additional nanoporous layer 606 can be less than the magnitude of the reflected light at the surface 460 between the TFT glass layer 410 and the first polarizer layer 408 (as described above with respect to FIG. 4). In short, the additional nanoporous layer 606 has an index of refraction less than the index of refraction of the TFT glass layer 410 to reduce specular reflection of the display structure 602.

For example, less than 2.5 percent of the light that is incident upon the surface 650 between the TFT glass layer 410 and the additional nanoporous layer 606 is reflected. For example, approximately 1.6 percent of the light that is incident upon the surface 650 between the TFT glass layer 410 and the additional nanoporous layer 606 is reflected. For example, between 1-2.5% percent of the light that is incident upon the surface 650 between the TFT glass layer 410 and the additional nanoporous layer 606 is reflected.

Referring back to FIG. 4, incoming light can be incident upon a surface 470 of the top surface layer 404 that is at an interface between the top surface layer 404 and the surrounding environment (e.g., air). The incoming light that is incident upon the surface 470 can be reflected. The reflected light can be based on (directly correlated to) the index of refraction of the top surface layer 404 and the surrounding environment.

In some examples, either of the display structures 502, 602 can include a mesoporous layer positioned on the top surface layer 404. The mesoporous layer is substantially the same as the porous layer 506 when the porous layer 506 includes the mesoporous material. In some examples, that mesoporous layer positioned on the top surface layer 404 can have an index of refraction less than the index of refraction of top surface layer 404. In some examples, the mesoporous layer can have an index of refraction of approximately 1.34.

By introducing the mesoporous layer on the surface of the top surface layer 404, the amount of light reflected by the top surface layer 404 at the surface 470 can be reduced and/or minimized—the brightness (luminescence or power) of the reflected light is reduced. Specifically, as a result of the mesoporous layer having an index of refraction less than the index of refraction of the top surface layer 404, the magnitude of the reflected light at the surface 470 of the top surface layer 404 can be reduced and/or minimized.

Figure 7:
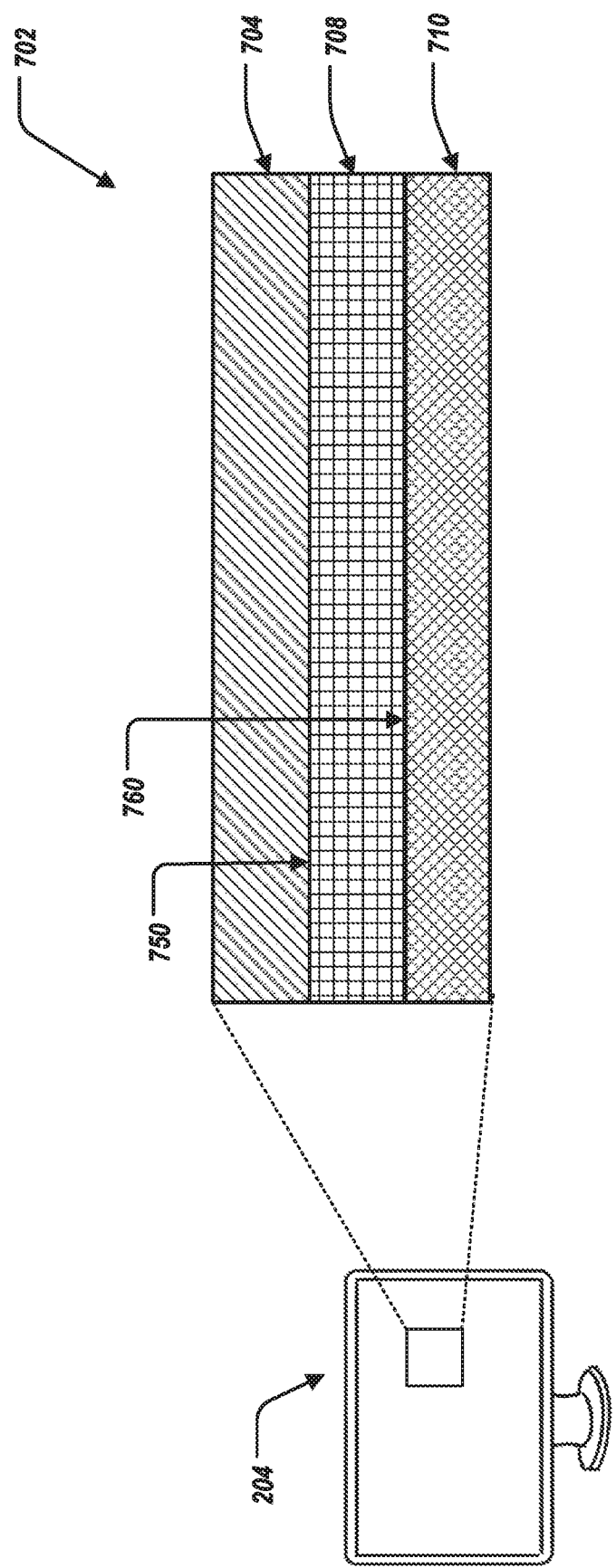
FIG. 7 illustrates an example cross-sectional view of an organic light emitting diode (OLED) display device.

FIG. 7 illustrates a cross-sectional view of an example display structure 702 of the display device 204. The display structure 402 can be an organic light emitting diode (OLED) display structure. The display structure 702 can include a top surface layer 704, a polarizer layer 708, and an organic light emitting diode (OLED) film layer 710. The polarizer layer 708 is positioned between the top surface layer 704 and the OLED film layer 710. The top surface layer 704 can be glass, or plastic. The top surface layer 704 can include a cellulose triacetate film (TAC), a polystyrene material, or a cyclo-olefin polymer material.

The display device 204, and specifically, each of the layers of the display structure 702 can be associated with an index of refraction. To that end, each of the layers of the display structure 402 reflect incident light (e.g., the incoming light 222, 322) as reflected light (e.g., reflected light 240, 340) based on the index of refraction of the layer. Specifically, the amount of reflection of light that is incident upon a surface (interface) between layers of the display structure 702 is directly correlated to the index of reflection of each such layer (the index of refraction is a physical property of a material of each layer). Thus, the brightness or luminescence (or power) of the reflected light by each layer of the display structure 702 that is incident thereupon is based on the index of refraction of each layer of the display structure 702.

For example, incoming light can be incident upon a surface 750 of the top surface layer 704 that is at an interface between the top surface layer 704 and the polarizer layer 708. The incoming light that is incident upon the surface 750 can be reflected. The reflected light can be based on (directly correlated to) the index of refraction of the top surface layer 704 and the polarizer layer 708. That is, the brightness (luminescence, power) of the reflected light at the surface 750 between the top surface layer 704 and the polarizer layer 708 can have a magnitude. For example, approximately 4% of the light that is incident upon the surface 750 between the top surface layer 704 and the polarizer layer 708 can be reflected.

FIG. 8 illustrates a cross-sectional view of an example display structure 802 of the display device 204. The display structure 802 can include the display structure 702 of FIG. 7, and further include a nanoporous layer 806. Specifically, the nanoporous layer 806 is positioned between the top surface layer 704 and the polarizer layer 708. The nanoporous layer 806 can be substantially the same as the nanoporous layer/material of the porous layer 506 described above with respect to FIG. 5.

In some examples, that nanoporous layer 806 can have an index of refraction less than the index of refraction of the top surface layer 704. In some examples, the nanoporous layer 806 can have an index of refraction less than the index of refraction of the polarizer layer 708. In some examples, the nanoporous layer 806 can have an index of refraction less than 1.5. In some examples, the nanoporous layer 806 can have an index of refraction of approximately 1.3. In some examples, the nanoporous layer 806 can have an index of refraction of approximately 1.13.

Incoming light can be incident upon a surface 850 of the top surface layer 704 that is at an interface between the top surface layer 704 and the nanoporous layer 806. The incoming light that is incident upon the surface 850 can be reflected. The reflected light can be based on (directly correlated to) the index of refraction of the top surface layer 704 and the nanoporous layer 806. That is, the brightness (luminescence, power) of the reflected light at the surface 850 between the top surface layer 704 and the nanoporous layer 806 can have a magnitude.

By introducing the nanoporous layer 806 between the top surface layer 704 and the polarizer layer 708, the amount of light reflected by the top surface layer 704 can be reduced and/or minimized—the brightness (luminescence or power) of the reflected light is reduced. Specifically, as a result of the nanoporous layer 806 having an index of refraction less than the index of refraction of the top surface layer 704 and/or the polarizer layer 708, the magnitude of the reflected light at the surface 850 between the top surface layer 704 and the nanoporous layer 806 can be less than the magnitude of the reflected light at the surface 750 between the top surface layer 704 and the polarizer layer 708 (as described above with respect to FIG. 7). In short, the nanoporous layer 806 has an index of refraction less than the index of refraction of the top surface layer 704 to reduce specular reflection of the display structure 802.

For example, less than 2.5 percent of the light that is incident upon the surface 850 between the top surface layer 704 and nanoporous layer 806 is reflected. For example, approximately 1.6 percent of the light that is incident upon the surface 850 between the top surface layer 704 and nanoporous layer 806 is reflected. For example, between 1-2.5% percent of the light that is incident upon the surface 850 between the top surface layer 704 and nanoporous layer 806 is reflected.

Referring back to FIG. 7, incoming light can be incident upon a surface 760 of the OLED film layer 710 that is at an interface between the OLED film layer 710 and the polarizer layer 708. The incoming light that is incident upon the surface 760 can be reflected. The reflected light can be based on (directly correlated to) the index of refraction of the OLED film layer 710 and the polarizer layer 708. That is, the brightness (luminescence, power) of the reflected light at the surface 760 between the OLED film layer 710 and the polarizer layer 712 can have a magnitude.

FIG. 9 illustrates a cross-sectional view of an example display structure 902 of the display device 204. The display structure 902 can include the display structure 702 of FIG. 7, and further include an additional nanoporous layer 906. Specifically, the additional nanoporous layer 906 is positioned between the polarizer layer 708 and the OLED film layer 710. The additional nanoporous layer 906 is substantially the same as the nanoporous layer 806.

In some examples, that nanoporous layer 906 can have an index of refraction less than the index of refraction of OLED film layer 710. In some examples, the nanoporous layer 906 can have an index of refraction less than the index of refraction of the polarizer layer 712. In some examples, the nanoporous layer 906 can have an index of refraction less than 1.5. In some examples, the nanoporous layer 906 can have an index of refraction of approximately 1.3. In some examples, the nanoporous layer 906 can have an index of refraction of approximately 1.13.

Incoming light can be incident upon a surface 950 of the OLED film layer 710 that is at an interface between the OLED film layer 710 and the additional nanoporous layer 906. The incoming light that is incident upon the surface 950 can be reflected. The reflected light can be based on (directly correlated to) the index of refraction of the OLED film layer 710 and the additional nanoporous layer 906. That is, the brightness (luminescence, power) of the reflected light at the surface 950 between the OLED film layer 710 and the additional nanoporous layer 906 can have a magnitude.

By introducing the additional nanoporous layer 906 between the OLED film layer 710 and the polarizer layer 708, the amount of light reflected by the OLED film layer 710 can be reduced and/or minimized—the brightness (luminescence or power) of the reflected light is reduced. Specifically, as a result of the additional nanoporous layer 906 having an index of refraction less than the index of refraction of the OLED film layer 710 and/or the polarizer layer 708, the magnitude of the reflected light at the surface 950 between the OLED film layer 710 and the additional nanoporous layer 906 can be less than the magnitude of the reflected light at the surface 760 between the OLED film layer 710 and the polarizer layer 708 (as described above with respect to FIG. 7). In short, the additional nanoporous layer 906 has an index of refraction less than the index of refraction of the OLED film layer 710 to reduce specular reflection of the display structure 902.

For example, less than 2.5 percent of the light that is incident upon the surface 950 between the OLED film layer 710 and the additional nanoporous layer 906 is reflected. For example, approximately 1.6 percent of the light that is incident upon the surface 950 between the OLED film layer 710 and the additional nanoporous layer 906 is reflected. For example, between 1-2.5% percent of the light that is incident upon the surface 950 between the OLED film layer 710 and the additional nanoporous layer 906 is reflected.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A display structure for an information handling system, including:
    a top surface layer;
    a first nanoporous layer;
    a first polarizer layer;
    a second nanoporous layer;
    a thin-film-transistor (TFT) layer;
    a second polarizer layer; and
    a back light layer,
    wherein the first nanoporous layer is positioned between the top surface layer and the first polarizer layer, and the second nanoporous layer is positioned between the first polarizer layer and the TFT layer, and
    wherein the first nanoporous layer has an index of refraction less than an index of refraction of the top surface layer to reduce specular reflection of the display structure, and the second nanoporous layer has an index of refraction less than an index of refraction of the TFT layer to reduce specular reflection of the display structure.

2. The display structure of claim 1, further comprising a mesoporous layer positioned on the top surface layer.

3. The display structure of claim 1, further comprising a mesoporous layer positioned between the first nanoporous layer and the first polarizer layer.

4. The display structure of claim 1, wherein the top surface layer is glass.

5. The display structure of claim 1, wherein the top surface layer is plastic.

6. The display structure of claim 1, wherein the index of refraction of the first nanoporous layer is less than 1.5.

7. The display structure of claim 1, wherein the index of refraction of the first nanoporous layer is approximately 1.3.

8. The display structure of claim 1, wherein the index of refraction of the first nanoporous layer is approximately 1.13.

9. The display structure of claim 1, wherein the specular reflection of the display structure is approximately 1.6 percent of incident light upon the display structure.

10. The display structure of claim 1, wherein the display structure is a liquid crystal display (LCD) display structure.

11. A display structure for an information handling system, including:
    a top surface layer;
    a first nanoporous layer;
    a polarizer layer;
    a second nanoporous layer; and
    an organic light emitting diode (OLED) film layer,
    wherein the first nanoporous layer is positioned between the top surface layer and the polarizer layer, wherein the second nanoporous layer is positioned between the polarizer layer and the OLED film layer, and
    wherein the first nanoporous layer has an index of refraction less than an index of refraction of the top surface layer to reduce specular reflection of the display structure, and wherein the second nanoporous layer has an index of refraction less than an index of refraction of the OLED film layer to reduce specular reflection of the display structure.

12. The display structure of claim 11, further comprising a mesoporous layer positioned on the top surface layer.

13. The display structure of claim 11, wherein the top surface layer is glass.

14. The display structure of claim 11, wherein the top surface layer is plastic.

15. The display structure of claim 11, wherein the index of refraction of the nanoporous layer is less than 1.5.

16. The display structure of claim 11, wherein the index of refraction of the nanoporous layer is approximately 1.3.

17. The display structure of claim 11, wherein the index of refraction of the nanoporous layer is approximately 1.13.

18. The display structure of claim 11, wherein the display structure is an OLED display structure.

* * * * *